(12) United States Patent
Yang et al.

(10) Patent No.: US 6,433,420 B1
(45) Date of Patent: Aug. 13, 2002

(54) SEMICONDUCTOR PACKAGE WITH HEAT SINK HAVING AIR VENT

(75) Inventors: Chung Hsien Yang; Yu Ting Lai, both of Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/909,293

(22) Filed: Jul. 19, 2001

(30) Foreign Application Priority Data

Feb. 13, 2001 (TW) ........................................ 90103085 A

(51) Int. Cl.[7] ........................ H01L 23/34; H01L 23/495; H01L 23/48; H01L 23/52; H01L 29/40
(52) U.S. Cl. ........................ 257/712; 257/713; 257/667; 257/717; 257/774; 257/780; 257/738; 257/704; 257/710
(58) Field of Search ................................ 257/667, 712, 257/713, 710, 704, 787, 706, 737, 738, 680, 774, 717

(56) References Cited

U.S. PATENT DOCUMENTS

| | | | | |
|---|---|---|---|---|
| 5,105,259 A | * | 4/1992 | McShane et al. | |
| 5,597,643 A | * | 1/1997 | Weber | 361/688 |
| 5,652,463 A | * | 7/1997 | Weber et al. | 257/706 |
| 5,851,377 A | | 12/1998 | Bush | 208/48 |
| 5,977,626 A | | 11/1999 | Wang et al. | 257/707 |
| 5,982,621 A | * | 11/1999 | Li | 257/706 |
| 6,117,695 A | * | 9/2000 | Murphy et al. | 438/15 |
| 6,232,652 B1 | * | 5/2001 | Matsushima | 257/667 |
| 6,239,486 B1 | * | 5/2001 | Shimizu et al. | 257/704 |
| 6,246,115 B1 | * | 6/2001 | Tang et al. | 257/706 |
| 6,256,202 B1 | * | 7/2001 | Murphy | 257/718 |
| 6,278,182 B1 | * | 8/2001 | Liu et al. | 257/712 |
| 6,288,900 B1 | * | 9/2001 | Jognson et al. | 257/706 |
| 6,294,408 B1 | * | 9/2001 | Edwards et al. | 438/121 |
| 6,323,066 B2 | * | 11/2001 | Lai et al. | 438/122 |

FOREIGN PATENT DOCUMENTS

JP 11-274179 * 10/1999

* cited by examiner

Primary Examiner—Alexander O. Williams
(74) Attorney, Agent, or Firm—Peter F. Corless; Steven M. Jensen; Edwards & Angell, LLP

(57) ABSTRACT

A BGA semiconductor package having an embedded heat sink is proposed. The heat sink mounted on a substrate includes a flat portion and supporting members for supporting the flat portion to be positioned above a semiconductor chip. The flat portion is formed with at least one taper air vent for ventilating air in a gap between the flat portion and the chip during a molding process. This further helps prevent voids from forming in an encapsulant due to the air trapped in a molding resin as being flowing slowly through the gap, and avoid the occurrence of a popcorn effect on the encapsulant during a temperature cycle in subsequent processes. As a result, quality and yield for the packaged products can be significantly improved.

9 Claims, 3 Drawing Sheets

SEMICONDUCTOR PACKAGE WITH HEAT SINK HAVING AIR VENT

FIELD OF THE INVENTION

The present invention relates to semiconductor packages, and more particularly, to a semiconductor package with a heat sink having air vents.

BACKGROUND OF THE INVENTION

A ball grid array (BGA) semiconductor package is the mainstream in packaged products for providing high density of electronic components and electronic circuits mounted therein with sufficient I/O connections, and accordingly array-arranged solder balls connected to the I/O connections are increased in number and density. As a result increase in heat generated in operating the semiconductor package can be expected, and the generated heat then requires to be dissipated effectively, otherwise, the reliability and life-time of the semiconductor package may be detrimentally affected.

Besides, in the foregoing semiconductor package, materials used for making a substrate for mounting a semiconductor chip thereon and for making an encapsulant for encapsulating the semiconductor chip are also critical in consideration of the heat dissipation. For example, in a plastic BGA (PBGA), ceramic BGA (CBGA) or tape BGA (TBGA) semiconductor package, the substrate is widely made of a resin or ceramic material having the heat dissipating efficiency much poorer than a metallic material. Further, the encapsulant is made of a molding resin having a sufficiently small coefficient of conductivity approximately only 0.8 w/m☐k, which makes the heat generated from the semiconductor chip with electron circuits and electronic elements mounted thereon not able to be dissipated to the atmosphere effectively, and thus the reliability of the semiconductor chip is degraded. Therefore, a BGA semiconductor package having a heat sink of god thermal conductivity is disclosed in U.S. Pat. Nos. 5,851,377 and 5,977,626 for improving the heat dissipating efficiency.

Illustrated in FIG. 1 is the conventional semiconductor package 2 having the heat sink 23. A semiconductor chip 21 is attached to a substrate 20 by means of an adhesive 212 such as silver paste, and then is electrically connected to the substrate 20 through gold wires 22. Subsequently, the heat sink 23 is mounted at pre-determined positions on the substrate 20 in no contact with the semiconductor chip 21 and the gold wires 22 positioned below a flat portion 230 of the heat sink 23, wherein the flat portion 230 downwardly extends to form supporting members 231 for strongly supporting the flat portion 230 on the substrate 20. Thereafter, a molding process is performed to form an encapsulant 24 for encapsulating the semiconductor chip 21, the gold wires 22 and the heat sink 23, while the flat portion 230 of the heat sink is partially exposed to the outside of the encapsulant 24. Finally, with the implantation of solder balls 25, the semiconductor package 2 is completed in fabrication.

The fabricated semiconductor package 2 is of a thickness approximately 1.17 mm, wherein, excluding the thinness of the semiconductor chip 21, the adhesive 212 and the heat sink 23, a 0.54 mm gap d is remained for filing the encapsulant 24 therein, that is, the heat generated from the semiconductor chip 21 needs to pass a 0.54 mm-long path through the encapsulant 24 before reaching the heat sink 23 to be dissipated to the atmosphere. However, as the encapsulant 24 is rather poor in thermal conduction, which makes the heat dissipating efficiency reduced, and further results in decrease in the reliability of the semiconductor chip. Therefore, in the fabrication of the semiconductor package, it tends to shorten the heat dissipating path i.e. the gap d, so as to improve the heat dissipating efficiency and reduce the overall thickness of the semiconductor package as well as save the packaging cost.

However, the shortening for the heat-dissipating path is restricted in accordance with the application of the heat sink embedded in the above semiconductor package, and accordingly problems are possibly generated.

First, during the molding process, as shown in FIG. 2, a molten resin 34 flows into a runner 36 formed by molds 37 and a substrate 30 clamped by the molds 37, and then through an injecting gate 38 into a mold cavity 372. As the molten resin 34 flows from the injecting gate 38 into the relatively wider mold cavity 372, the resin flow rate increases; then while the molten resin 34 further flow to a gap 39 between a semiconductor chip 31 and a heat sink 33, the flow rate slows down since the gap 39 is narrower than the mold cavity 372. This results in an unstable resin flow rate as the molten resin 34 flows faster at the outside of the gap 39 than inside of the gap 39, as illustrated as dotted lines in a resin flow curve of FIG. 3. Due to the unstable flow rate, air in the gap 39 can not be escaped through an air channel 373, and is trapped in the gap 39 to form voids. The void formation will increase the heat resistance, and accordingly the heat dissipating efficiency will be reduced. Moreover, a popcorn effect will also be generated as proceeding subsequent processes for fabricating the semiconductor package under a high temperature due to the void formation, and thus the semiconductor package will be damaged by the popcorn effect and the relability thereof is definitely degraded.

In addition, further in the semiconductor package with the heat sink tightly bonded to the encapsulant, a thermal stress is generated due to temperature variations in a reflow solder process and a temperature cycle of a reliability test, according to the difference in coefficient of thermal expansion (CTE) between the heat sink and the encapsulant. This makes the heat sink and the encapsulant differently deformed, resulting in warpage and delamination for degrading the reliability of the semiconductor package.

SUMMARY OF THE INVENTION

A objective of the present invention is to provide a semiconductor package with a heat sink having taper air vents for ventilating air in a mold cavity, and for avoiding voids formed in an encapsulant in a gap between a semiconductor chip and the heat sink during a molding process. Moreover, the semiconductor package of the invention is capable of dispersing a thermal stress on the encapsulant and the heat sink for preventing warpage and delamination from occurrence, so as to assure the reliability of the semiconductor package.

According to the foregoing and other objectives, the semiconductor package of the present invention comprises: a substrate having a first surface and a second surface; a semiconductor chip having a first surface and a second surface, while the second surface of the chip is attached to the first surface of the substrate; a plurality of first conductive elements (i.e. gold wires) for electrically connecting the chip to the substrate; an embedded heat sink mounted on the first surface of the substrate and having a flat portion and a plurality of supporting members, while the supporting members are used to support the flat portion of the heat sink to be positioned above the chip without contacting the first conductive elements; a plurality of second conductive elements (i.e. solder balls) mounted on the second surface of the substrate for electrically connecting the chip to an external device; and an encapsulant for encapsulating the chip, the first conductive elements and the heat sink while the flat portion of the heat sink is partially exposed to the outside of the encapsulant.

The invention is further characterized in forming at least one taper air vent in the flat portion of the heat sink, wherein the taper air vent has a wide opening facing the semiconductor chip and a narrow opening exposed to the outside of the semiconductor package. During a molding process, air in a gap between the heat sink and the chip allows to be escaped through the taper air vents so as to prevent voids from forming in the encapsulant. As the result, the semiconductor package can be improved in heat dissipating efficiency, and a popcorn effect can be prevented from occurring in the encapsulant, as well as the yield of the packaged products can be raised.

On the other hand, unlike a conventional semiconductor package having an embedded heat sink tightly bonded to an encapsulant, the semiconductor package of the invention is formed with at least one air vent in the flat portion of the heat sink, allowing a thermal stress generated by the heat sink during molding to be dispersed as well as planarity of the flat portion of the heat sink to be maintained.

BRIEF DESCRIPTION OF THE DRAWING

The invention can be more fully understood by reading the following detailed description of the preferred embodiments, with reference made to the accompanying drawings, wherein.

DETAILED DESCRIPTION OF THE PREFERRED EMBODIMENT

Figure 1:
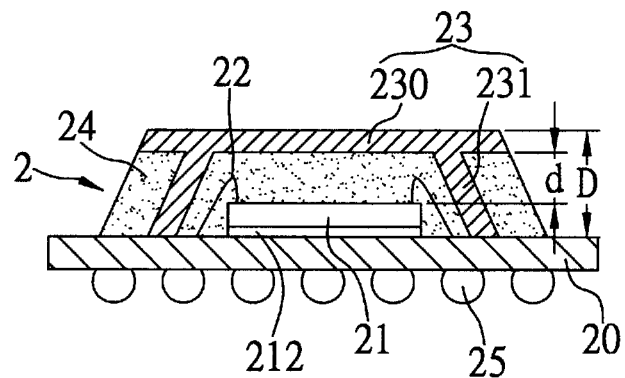
FIG. 1 (PRIOR ART) is a sectional view of a conventional BGA semiconductor package having an embedded heat sink.
Figure 2:
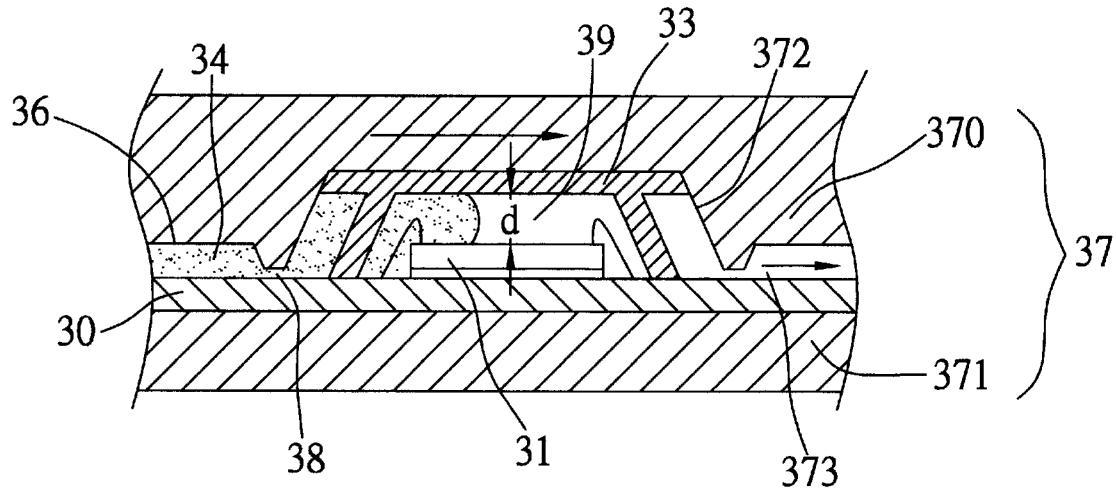
FIG. 2 (PRIOR ART) is a sectional view of a conventional BGA semiconductor package during a molding process.
Figure 3:
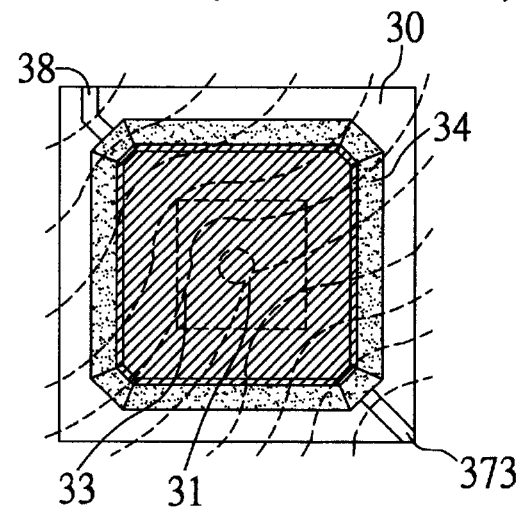
FIG. 3 (PRIOR ART) is a resin flow curve of a conventional BGA semiconductor package having an embedded heat sink.
Figure 4:
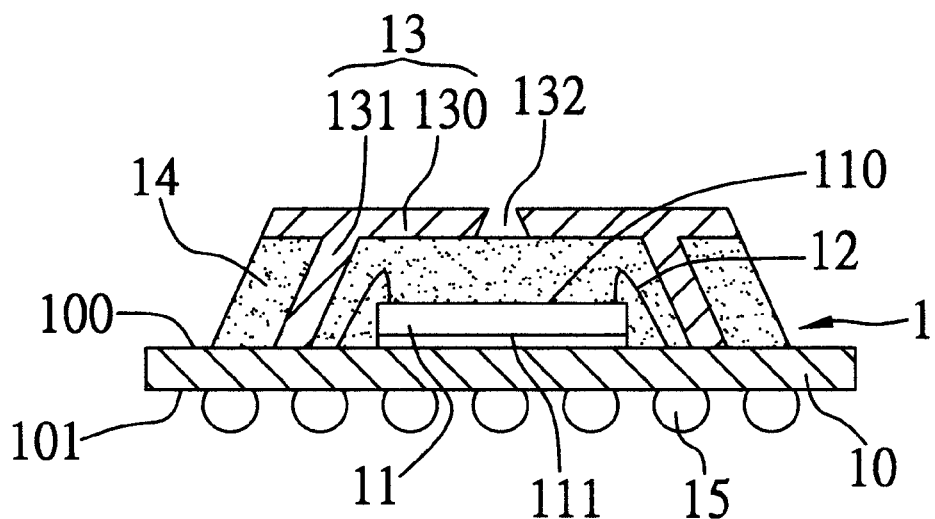
FIG. 4 is a sectional view of the semiconductor package of the invention.

Illustrated in FIG. 4 is a sectional view of the semiconductor package of the invention. The semiconductor package 1 comprises a substrate 10; a semiconductor chip 11 mounted on the substrate 10; a plurality of gold wires 12 for electrically connecting the semiconductor chip 11 to the substrate 10; a heat sink 13 mounted on the substrate 10; an encapsulant 14 for encapsulating the chip 11, the gold wires 12, and part of the heat sink 13; and a plurality of solder balls 15 mounted on the substrate 10.

The substrate 10 has a first surface 100 and a second surface 101, while a plurality of conductive traces (not shown) are mounted on both surfaces 100 and 101 respectively. Further, a plurality of conductive vias (not shown) are formed in the substrate for electrically connecting the conductive traces on the first surface 100 to those on the second surface 101. Moreover, the solder balls 15 are mounted to terminals of the conductive traces on the second surface 101 of the substrate 10 for electrically connecting the chip 11 to an external device such as a printed circuit board after the chip 11 is electrically connected to the substrate 10. The substrate 10 can be made of epoxy resin, polyimide resin, triazine, a ceramic material or a glass material, wherein bismaleimidetriazine (BT) resin is preferable.

The semiconductor chip 11 has a first surface 110 and a second surface 111. On the first surface 110 there are mounted a plurality of electronic elements and electronic circuits, while the second surface 110 of the chip 11 is attached to the first surface 100 of the substrate 10 by means of an adhesive such as silver paste or polyimide tape.

Figure 5:
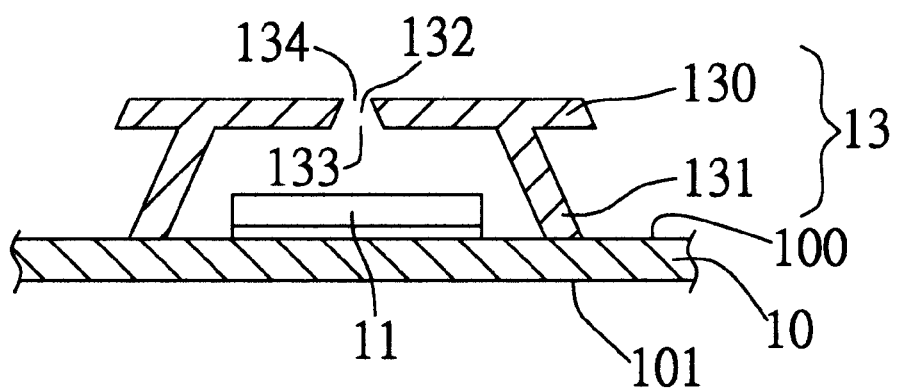
FIG. 5 is a sectional view of the semiconductor package of the invention prior to a molding process.
Figure 6:
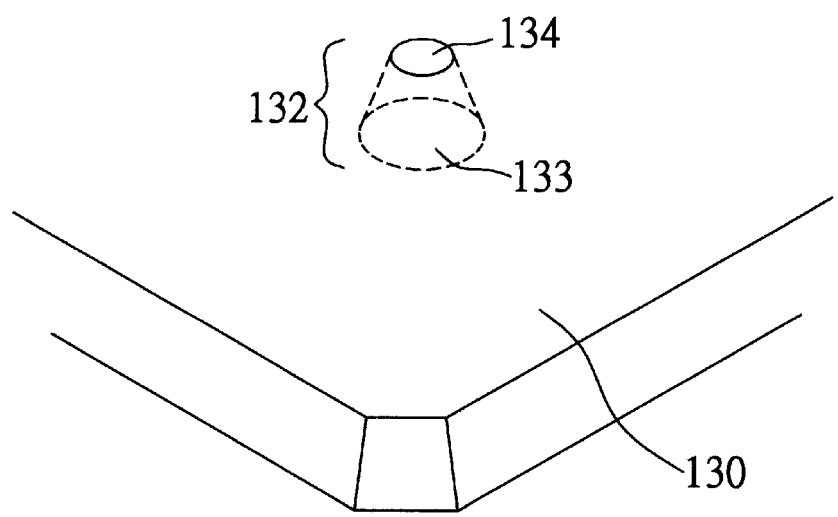
FIG. 6 is a perspective view showing part of a heat sink in the semiconductor package of the invention.
Figure 7:
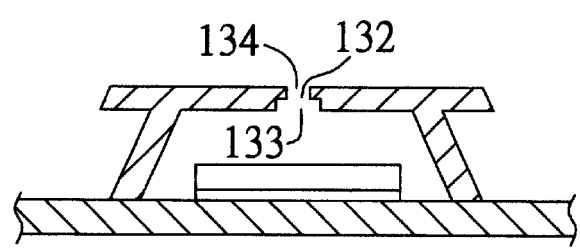
FIG. 7 is a sectional view of a heat sink in the semiconductor package of another preferred embodiment according to the invention.
Figure 8:
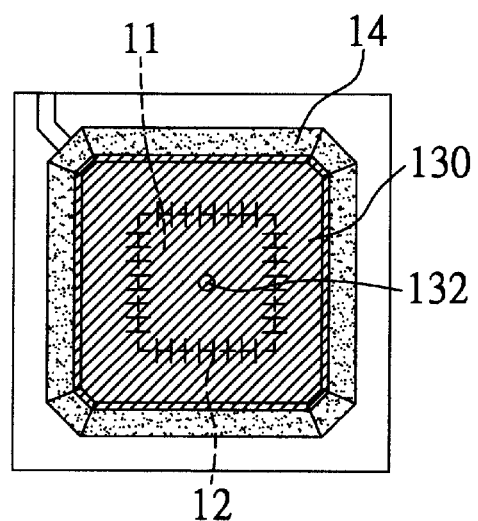
FIG. 8 is a top view of the semiconductor package of the invention.

The heat sink 13 is formed as an embedded heat sink, as shown in FIG. 5, which includes a flat portion 130 and a plurality of supporting members 131, wile the flat portion 130 has its entire upper surface exposed to the outside of the semiconductor package 1. The supporting members 131 are strongly attached to the first surface 100 of the substrate 10 through a conventional adhesive or a clamping effect generated from molds (not shown) during a molding process, so as to firmly support the flat portion 130 of the heat sink 13 to be positioned above the clip 11 without contacting the gold wires (not shown). Further in the flat portion 130, there is formed at least one taper air vent 132 by using a conventional punching technique. As shown in FIG. 6, the taper air vent 132 has a wide opening 133 facing the chip 11 and an exposed narrow opening 134 for preventing a molding resin from flashing on the exposed surface of the heat sink 13 during the formation of the encapsulant 14. The taper air vent 132 of the heat sink 13 in the invention can adopt various alterations in number and shape, if necessary, e.g. a ladder-like conical vent shown in FIG. 7. Additionally, FIG. 8 is a top view used for illustrating the overall structure of the semiconductor package of the invention.

Referring back to FIG. 4, the taper air vent 132 allows air in a gap between the flat portion 130 of the heat sink 13 and the first surface 110 of the chip 11 to be effectively ventilated, so as to prevent voids from forming in the encapsulant 14 due to the air trapped in a molding resin as being flowing slowly through the gap during molding, and thus the heat dissipating efficiency and reliability of the packaged product can be improved. Moreover, in subsequent processes, a thermal stress generated from the heat sink 13 can be dispersed through the air vent 132, so that planarity of the flat portion 130 of the heat sink 13 and the encapsulant 14 can be maintained.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package, comprising:
a substrate;
at least a semiconductor chip attached to the substrate and electrically connected to the substrate;
a heat sink having a flat portion and a plurality of supporting members, wherein the flat portion is formed with at least one taper air vent that has a wide opening facing the semiconductor chip and a narrow opening opposed to the wide opening, and the supporting members are used for supporting the flat portion to be positioned above the semiconductor chip;

a plurality of conductive elements mounted on the substrate for electrically connecting the semiconductor chip to an external device; and an encapsulant made of an encapsulating compound for encapsulating the semiconductor chip and the heat sink, wherein part or the heat sink and at least the narrow opening of the taper air vent arc partially exposed to outside of the encapsulant.

2. The semiconductor package of claim 1, wherein the heat sink is an embedded heat sink.

3. The semiconductor package of clam 1, wherein the flat portion has an entire surface thereof exposed to the outside of the semiconductor package.

4. The semiconductor package of claim 1, wherein the flat portion is integrally formed with the supporting members.

5. The semiconductor package of claim 1, wherein the air vent is ladder-like conical air vent.

6. The semiconductor package of claim 1, wherein a gap is formed between the flat portion of the heat sink and the semiconductor chip, allowing a molten resin used for forming the encapsulant to flow through the gap.

7. The semiconductor package of claim 1, wherein the heat sink is made of a thermal conductive metal.

8. The semiconductor package of claim 7, wherein the thermal conductive metal is copper.

9. The semiconductor package of claim 1, wherein the conductive elements are solder balls.

* * * * *